United States Patent
Milano et al.

(10) Patent No.: US 10,725,100 B2
(45) Date of Patent: *Jul. 28, 2020

(54) METHODS AND APPARATUS FOR MAGNETIC SENSOR HAVING AN EXTERNALLY ACCESSIBLE COIL

(71) Applicant: Allegro MicroSystems, LLC, Manchester, NH (US)

(72) Inventors: Shaun D. Milano, Dunbarton, NH (US); Michael C. Doogue, Bedford, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/837,982

(22) Filed: Mar. 15, 2013

(65) Prior Publication Data

US 2014/0266181 A1   Sep. 18, 2014

(51) Int. Cl.
*G01R 31/28*   (2006.01)
*G01R 33/02*   (2006.01)
(Continued)

(52) U.S. Cl.
CPC ..... *G01R 31/2884* (2013.01); *G01R 33/0017* (2013.01); *G01R 33/0035* (2013.01); *G01R 33/02* (2013.01); *G01R 33/07* (2013.01)

(58) Field of Classification Search
CPC ............... G01R 33/0035; G01R 33/07; G01R 33/0017; G01R 33/09; G01R 35/005; G01R 31/2884; G01R 33/0047; G01R 33/04; G01R 33/1215; G01R 3/011; G01R 3/0047; G01R 3/0052; G01R 3/02; G01R 3/06; G01R 3/07; G01R 3/072; G01R 3/075; G01R 3/077; G01R 3/09; G01R 3/091; G01R 3/093; G01R 3/095; G01R 3/096; G01R 3/098; G01R 3/0017; G01R 3/00;
(Continued)

(56) References Cited

U.S. PATENT DOCUMENTS 3,195,043 A   7/1965 Burig et al.
3,281,628 A   10/1966 Bauer et al.
(Continued)

FOREIGN PATENT DOCUMENTS

CH   683 469 A5   3/1994
DE   41 41 386 A1   6/1993
(Continued)

OTHER PUBLICATIONS

PCT/US2014/018209 PCT Invitation to Pay Additional Fees dated Jul. 7, 2014 7 pages.
(Continued)

*Primary Examiner* — Lee E Rodak
(74) *Attorney, Agent, or Firm* — Daly Crowley Mofford & Durkee, LLP

(57) ABSTRACT

Methods and apparatus for magnetic field sensor having a sensing element, an analog circuit path coupled to the sensing element for generating an output voltage in response to a magnetic field applied to the sensing element, and a coil in proximity to the sensing element, the coil having a first terminal that is accessible external to the magnetic field sensor.

25 Claims, 7 Drawing Sheets

(51) Int. Cl.
*G01R 33/00* (2006.01)
*G01R 33/07* (2006.01)

(58) Field of Classification Search
CPC ........ G01R 3/35; G01R 15/20; G01R 15/202;
G01R 15/207; G01D 5/12; G01D 5/125;
G01D 5/14; G01D 5/142; G01D 5/145;
G01D 5/147
USPC ................ 324/117 H, 207.11, 207.2–207.26,
324/244–263
See application file for complete search history.

(56) References Cited

U.S. PATENT DOCUMENTS

| | | |
|---|---|---|
| 3,607,528 A | 9/1971 | Gassaway |
| 3,661,061 A | 5/1972 | Tokarz |
| 3,728,786 A | 4/1973 | Lucas et al. |
| 4,048,670 A | 9/1977 | Eysermans |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,573,258 A | 3/1986 | Io et al. |
| 4,614,111 A | 9/1986 | Wolff |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Åström et al. |
| 4,760,285 A | 7/1988 | Nelson |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,908,685 A | 3/1990 | Shibasaki et al. |
| 4,910,861 A | 3/1990 | Dohogne |
| 4,935,698 A | 6/1990 | Kawaji et al. |
| 4,944,028 A | 7/1990 | Iijima et al. |
| 4,970,411 A | 11/1990 | Halg et al. |
| 4,983,916 A | 1/1991 | Iijima et al. |
| 5,012,322 A | 4/1991 | Guillotte |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,210,493 A | 5/1993 | Schroeder et al. |
| 5,216,405 A | 6/1993 | Schroeder et al. |
| 5,247,202 A | 9/1993 | Popovic et al. |
| 5,247,278 A | 9/1993 | Pant et al. |
| 5,250,925 A | 10/1993 | Shinkle |
| 5,289,344 A | 2/1994 | Gagnon et al. |
| 5,286,426 A | 3/1994 | Rano, Jr. et al. |
| 5,315,245 A | 5/1994 | Schroeder et al. |
| 5,329,416 A | 7/1994 | Ushiyama et al. |
| 5,332,965 A | 7/1994 | Wolf et al. |
| 5,351,028 A | 9/1994 | Krahn |
| 5,412,255 A | 5/1995 | Wallrafen |
| 5,414,355 A | 5/1995 | Davidson et al. |
| 5,424,558 A | 6/1995 | Borden et al. |
| 5,432,444 A | 7/1995 | Yasohama |
| 5,434,105 A | 7/1995 | Liou |
| 5,453,727 A | 9/1995 | Shibasaki et al. |
| 5,469,058 A | 11/1995 | Dunnam |
| 5,479,695 A | 1/1996 | Grader et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,514,953 A | 5/1996 | Schultz et al. |
| 5,521,501 A | 5/1996 | Dettmann et al. |
| 5,551,146 A | 9/1996 | Kawabata et al. |
| 5,581,170 A | 12/1996 | Mammano et al. |
| 5,581,179 A | 12/1996 | Engel et al. |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,886,070 A | 2/1999 | Honkura et al. |
| 5,883,567 A | 3/1999 | Mullins, Jr. |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,136,250 A | 10/2000 | Brown |
| 6,175,233 B1 | 1/2001 | McCurley et al. |
| 6,180,041 B1 | 1/2001 | Takizawa |
| 6,184,679 B1 | 2/2001 | Popovic et al. |
| 6,198,373 B1 | 3/2001 | Ogawa et al. |
| 6,265,865 B1 | 7/2001 | Engel et al. |
| 6,278,269 B1 | 8/2001 | Vig et al. |
| 6,351,506 B1 | 2/2002 | Lewicki |
| 6,356,068 B1 | 3/2002 | Steiner et al. |
| 6,392,478 B1 | 5/2002 | Mulder et al. |
| 6,424,018 B1 * | 7/2002 | Ohtsuka ............... G01R 15/202 257/421 |
| 6,429,640 B1 | 8/2002 | Daughton et al. |
| 6,436,748 B1 | 8/2002 | Forbes et al. |
| 6,437,558 B2 | 8/2002 | Li et al. |
| 6,501,270 B1 | 12/2002 | Opie |
| 6,545,332 B2 | 4/2003 | Huang |
| 6,545,457 B2 | 4/2003 | Goto et al. |
| 6,545,462 B2 | 4/2003 | Schott et al. |
| 6,687,644 B1 | 2/2004 | Zinke et al. |
| 6,692,676 B1 | 2/2004 | Vig et al. |
| 6,707,298 B2 | 3/2004 | Suzuki et al. |
| 6,759,843 B2 | 7/2004 | Furlong |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,853,178 B2 | 2/2005 | Hayat-Dawoodi |
| 6,896,407 B2 | 2/2005 | Nomiyama et al. |
| 6,902,951 B2 | 6/2005 | Goller et al. |
| 6,917,321 B1 | 7/2005 | Haurie et al. |
| 7,031,170 B2 | 4/2006 | Daeche et al. |
| 7,038,448 B2 | 5/2006 | Schott et al. |
| 7,132,825 B2 | 11/2006 | Martin |
| 7,190,784 B2 | 3/2007 | Li |
| 7,193,412 B2 | 3/2007 | Freeman |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,292,095 B2 | 11/2007 | Burt et al. |
| 7,319,319 B2 | 1/2008 | Jones et al. |
| 7,323,780 B2 | 1/2008 | Daubenspeck et al. |

(56) References Cited

U.S. PATENT DOCUMENTS

| | | | |
|---|---|---|---|
| 7,323,870 B2 | 1/2008 | Tatschl et al. |
| 7,325,175 B2 | 1/2008 | Momtaz |
| 7,361,531 B2 | 4/2008 | Sharma et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,573,112 B2 | 8/2009 | Taylor |
| 7,598,601 B2 | 10/2009 | Taylor et al. |
| 7,605,647 B1 | 10/2009 | Romero et al. |
| 7,635,993 B2 | 12/2009 | Boeve |
| 7,676,914 B2 | 3/2010 | Taylor |
| 7,687,882 B2 | 3/2010 | Taylor et al. |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,058,870 B2 | 11/2011 | Sterling |
| 8,063,634 B2 | 11/2011 | Sauber et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,559,139 B2 | 10/2013 | Theuss |
| 2002/0024109 A1* | 2/2002 | Hayat-Dawoodi .... G01R 33/07 257/421 |
| 2002/0084923 A1 | 7/2002 | Li |
| 2002/0097639 A1 | 7/2002 | Ishizaki et al. |
| 2003/0038675 A1 | 2/2003 | Gailus et al. |
| 2003/0102909 A1 | 6/2003 | Motz |
| 2004/0032251 A1 | 2/2004 | Zimmerman et al. |
| 2004/0046248 A1 | 3/2004 | Waelti et al. |
| 2004/0080314 A1 | 4/2004 | Tsujii et al. |
| 2004/0155644 A1 | 8/2004 | Stauth et al. |
| 2004/0184196 A1 | 9/2004 | Jayasekara |
| 2004/0207398 A1 | 10/2004 | Kudo et al. |
| 2005/0167790 A1 | 8/2005 | Khor et al. |
| 2005/0280411 A1 | 12/2005 | Bicking |
| 2006/0033487 A1 | 2/2006 | Nagano et al. |
| 2006/0038561 A1 | 2/2006 | Honkura et al. |
| 2006/0068237 A1 | 3/2006 | Murphy |
| 2006/0125473 A1 | 6/2006 | Frachon et al. |
| 2006/0175674 A1 | 8/2006 | Taylor |
| 2006/0181263 A1 | 8/2006 | Doogue et al. |
| 2006/0202692 A1 | 9/2006 | Tatschl et al. |
| 2006/0261801 A1 | 11/2006 | Busch |
| 2007/0110199 A1 | 5/2007 | Momtaz et al. |
| 2007/0170533 A1 | 7/2007 | Doogue et al. |
| 2007/0247141 A1 | 10/2007 | Pastre et al. |
| 2007/0285089 A1 | 12/2007 | Ibuki et al. |
| 2008/0013298 A1 | 1/2008 | Sharma et al. |
| 2008/0094055 A1 | 4/2008 | Monreal et al. |
| 2008/0137784 A1 | 6/2008 | Krone |
| 2008/0143329 A1* | 6/2008 | Ishihara ........................ 324/251 |
| 2008/0237818 A1 | 10/2008 | Engel et al. |
| 2008/0238410 A1 | 10/2008 | Charlier et al. |
| 2008/0258722 A1 | 10/2008 | Zon et al. |
| 2008/0270067 A1 | 10/2008 | Eriksen et al. |
| 2009/0001964 A1 | 1/2009 | Strzalkowski et al. |
| 2009/0001972 A1 | 1/2009 | Fernandez et al. |
| 2009/0085706 A1 | 4/2009 | Baarman et al. |
| 2009/0137398 A1 | 5/2009 | Bozovic et al. |
| 2009/0140725 A1 | 6/2009 | Ausserlechner |
| 2009/0152696 A1 | 6/2009 | Dimasacat et al. |
| 2009/0153138 A1 | 6/2009 | Theuss |
| 2009/0167301 A1 | 7/2009 | Ausserlechner |
| 2009/0168286 A1 | 7/2009 | Berkley et al. |
| 2009/0212765 A1* | 8/2009 | Doogue ............. G01R 33/0023 324/202 |
| 2009/0212771 A1* | 8/2009 | Cummings et al. .......... 324/252 |
| 2010/0026288 A1 | 2/2010 | Sauber |
| 2010/0033175 A1 | 2/2010 | Boeve et al. |
| 2010/0052667 A1 | 3/2010 | Kohama |
| 2010/0141249 A1* | 6/2010 | Ararao et al. ................. 324/244 |
| 2010/0188078 A1 | 7/2010 | Foletto et al. |
| 2010/0201356 A1 | 8/2010 | Koller et al. |
| 2010/0211347 A1* | 8/2010 | Friedrich ............ G01R 33/0023 702/117 |
| 2010/0237450 A1 | 9/2010 | Doogue et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0018533 A1 | 1/2011 | Cesaretti et al. |
| 2011/0031960 A1 | 2/2011 | Hohe et al. |
| 2011/0048102 A1 | 3/2011 | Fernandez et al. |
| 2011/0050220 A1 | 3/2011 | Bootle et al. |
| 2011/0248711 A1* | 10/2011 | Ausserlechner ...... G01R 15/207 324/251 |
| 2011/0285384 A1 | 11/2011 | Nomura |
| 2011/0298448 A1 | 12/2011 | Foletto et al. |
| 2012/0013333 A1 | 1/2012 | Ararao et al. |
| 2012/0086090 A1 | 4/2012 | Sharma et al. |
| 2012/0091994 A1 | 4/2012 | Han et al. |
| 2012/0161759 A1 | 6/2012 | Pozzati et al. |
| 2012/0182010 A1* | 7/2012 | Lammel ............. G01R 33/0035 324/244 |
| 2012/0274314 A1 | 11/2012 | Cesaretti et al. |
| 2012/0293164 A1 | 11/2012 | Liou et al. |
| 2012/0293167 A1* | 11/2012 | Kitanaka ................. G01D 5/147 324/207.25 |
| 2013/0093412 A1 | 4/2013 | Anelli et al. |
| 2013/0138372 A1* | 5/2013 | Ausserlechner ................ 702/65 |
| 2013/0241543 A1 | 9/2013 | Stenson et al. |
| 2013/0300406 A1 | 11/2013 | Pepka et al. |

FOREIGN PATENT DOCUMENTS

| | | |
|---|---|---|
| DE | 195 39 458 A1 | 4/1997 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2007 044485 A1 | 4/2009 |
| DE | 10 2010 028 390 A1 | 11/2011 |
| DE | 10 2010 028390 A1 | 11/2011 |
| DE | 10 2011 102 483 A1 | 11/2012 |
| DE | 10 2011 102483 A1 | 11/2012 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 361 456 A2 | 4/1990 |
| EP | 0 361 456 A3 | 4/1990 |
| EP | 0 680 103 A1 | 11/1995 |
| EP | 0 898 180 A2 | 2/1999 |
| EP | 1306687 A2 | 5/2003 |
| EP | 1 403 648 A1 | 3/2004 |
| EP | 1 443 332 A1 | 8/2004 |
| EP | 1 637 898 A1 | 3/2006 |
| EP | 1 679 524 A1 | 7/2006 |
| EP | 1 783 507 A1 | 5/2007 |
| EP | 1 850 143 A1 | 10/2007 |
| EP | 2 063 229 A1 | 5/2009 |
| EP | 2 108 966 A1 | 10/2009 |
| FR | 2 748 105 | 10/1997 |
| GB | 2 276 727 A | 10/1994 |
| JP | SHO 61-48777 | 3/1986 |
| JP | S63-051647 | 3/1988 |
| JP | 363 084176 A | 4/1988 |

(56) References Cited

FOREIGN PATENT DOCUMENTS

| | | |
|---|---|---|
| JP | 63-263782 | 10/1988 |
| JP | H04-095817 | 3/1992 |
| JP | 04-152688 | 5/1992 |
| JP | H04-357858 | 12/1992 |
| JP | 08-097486 | 4/1996 |
| JP | H08-264569 | 10/1996 |
| JP | H08-511348 A | 11/1996 |
| JP | 09-166612 | 6/1997 |
| JP | H10-022422 | 1/1998 |
| JP | 11-074142 | 3/1999 |
| JP | 2000-183241 A | 6/2000 |
| JP | 2004-055932 | 2/2001 |
| JP | 2001-141738 A | 5/2001 |
| JP | 2002-365350 A | 12/2002 |
| JP | 2003-177171 | 6/2003 |
| JP | 2003-202365 A | 7/2003 |
| JP | 2003-287439 A | 10/2003 |
| JP | 2004-053499 A | 2/2004 |
| JP | 2004-177228 A | 6/2004 |
| JP | 2004-356338 | 12/2004 |
| JP | 2006-3116 A | 1/2006 |
| JP | 2006-123012 A | 5/2006 |
| JP | 2006-275764 | 10/2006 |
| JP | 2008-513762 A | 5/2008 |
| JP | 2008-151530 | 7/2008 |
| JP | 2008-180550 | 8/2008 |
| JP | 2009-222524 | 10/2009 |
| JP | 2010-537207 A | 12/2010 |
| JP | 2011-052036 A | 3/2011 |
| JP | 2012-501446 A | 1/2012 |
| KR | 10-2010-0135747 | 12/2010 |
| KR | 10-2011-0085725 | 7/2011 |
| KR | 2012-0040247 A | 4/2012 |
| WO | WO 94/29672 A1 | 12/1994 |
| WO | WO 96/02849 A1 | 2/1996 |
| WO | WO 98/25148 | 6/1998 |
| WO | WO 2003/107018 A1 | 12/2003 |
| WO | WO 2004/027436 | 4/2004 |
| WO | WO 2004/072672 | 8/2004 |
| WO | WO 2006/056829 | 6/2006 |
| WO | WO 2006/083479 | 8/2006 |
| WO | WO 2007/138508 A1 | 12/2007 |
| WO | WO 2008/008140 A2 | 1/2008 |
| WO | WO 2008/008140 A3 | 1/2008 |
| WO | WO 2008/048379 A1 | 4/2008 |
| WO | WO 2008/121443 A1 | 10/2008 |
| WO | WO 2009/108422 A2 | 9/2009 |
| WO | WO 2009/108422 A3 | 9/2009 |
| WO | WO 2010/027658 A2 | 3/2010 |
| WO | WO 2010/065315 | 6/2010 |
| WO | WO 2010/096367 A1 | 8/2010 |
| WO | WO 2011/011479 | 1/2011 |
| WO | WO 2013/141981 | 9/2013 |

OTHER PUBLICATIONS

Notification of transmittal of the International Search Report and the Written Opinion of the International Searching Authority, or the Declaration, PCT/US2014/018209 dated Sep. 5, 2014, 10 pages.
Written Opinion of the International Searching Authority, PCT/US2014/018209 dated Sep. 5, 2014, 12 pages.
U.S. Appl. No. 12/840,324, filed Jul. 21, 2010, Cesaretti et al.
U.S. Appl. No. 13/350,970, filed Jan. 16, 2012, Milano et al.
U.S. Appl. No. 13/398,127, filed Feb. 16, 2012, Cesaretti et al.
U.S. Appl. No. 13/468,478, filed May 10, 2012, Pepka et al.
U.S. Appl. No. 13/743,451, filed Jan. 17, 2013, Friedrich et al.
Notice of Allowance; dated Feb. 11, 2011; for U.S. Appl. No. 12/037,393; 7 pages.
Office Action; dated Feb. 2, 201;1 from U.S. Appl. No. 12/959,672; 13 pages.
Response to Office Action; filed May 25, 2011; for Office Action dated Feb. 2, 2011; from U.S. Appl. No. 12/959,672; 7 pages.
Notice of Allowance; dated Jul. 19, 201;1 for U.S. Appl. No. 12/959,672; 8 pages.
Office Action; dated Jun. 7, 2012; for U.S. Appl. No. 12/360,889; 9 pages.
Response to Office Action; dated Sep. 27, 2012; for U.S. Appl. No. 12/360,889; 12 pages.
Office Action; dated Jan. 18, 2013; for U.S. Appl. No. 12/360,889; 7 pages.
Response to Office Action; dated Apr. 15, 2013; for U.S. Appl. No. 12/360,889; 7 pages.
Office Action; dated Jul. 6, 2012; in U.S. Appl. No. 12/706,318; 29 pages.
Response to Office Action; dated Jul. 6, 2012; filed Sep. 27, 2012; in U.S. Appl. No. 12/706,318; 12 pages.
Supplemental Response to Office Action; dated Jul. 6, 2012; filed Oct. 2, 2012; ; in U.S. Appl. No. 12/706,318; 12 pages.
U.S. Notice of Allowance; dated Dec. 10, 2012; for U.S. Appl. No. 12/706,318, 9 pages.
Office Action; dated Sep. 11, 2012; from U.S. Appl. No. 12/840,324, 30 pages.
Response to Office Action; filed Dec. 11, 2012; Office Action dated Sep. 11, 2012; in U.S. Appl. No. 12/840,324; 15 pages.
Final Office Actio;n dated Feb. 12, 201;3 for U.S. Appl. No. 12/840,324; 19 pages.
Response to Office Action; filed May 13, 2013; Office Action dated Feb. 12, 2013; in U.S. Appl. No. 12/840,324; 16 pages.
Notice of Allowance; dated May 24, 2013; for U.S. Appl. No. 12/840,324; 12 pages.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
Allegro MicroSystems, Inc., Hall-Effect IC Applications Guide, http://www.allegromicro.com/en/Products/Design/an/an27701.pdf, Copyright 1987, 1997, pp. 1-36.
Alllegro "True Zero-Speed Low-Jitter High Accuracy Gear Tooth Sensor;" ATS625LSG; 2005; Allegro MicroSystems, Inc. Worcester, MA 01615; pp. 1-21.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "Limits of Offset Cancellation by the Principle of Spinning Current Hall Probe;" Proceedings of IEEE Sensors; Oct. 2004; pp. 1117-1120.
Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007; pp. 1326-1334.
Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Bowers et al., "Microfabrication and Process Integration of Powder-Based Permanent Magnets", Interdisciplinary Microsystems Group, Dept. Electrical and Computer Engineering, University of Florida, USA; Technogies for Future Micro-Nano Manufacturing Workshop, Napa, California, Aug. 8-10, 2011, pp. 162-165.
Cesaretti et al.; "Effect of Stress Due to Plastic Package Moisture Absorption in Hall Sensors;" IEEE Transactions on Magnets; vol. 45; No. 10; Oct. 2009; pp. 4482-4485.

(56) References Cited

OTHER PUBLICATIONS

Demierre, et al.; "Reference Magnetic Actuator for Self-Calibration of a Very Small Hall Sensor Array;" Sensors and Actuators A97-98; Apr. 2002; pp. 39-46.

Dwyer, "Back-Biased Packaging Advances (SE, SG & SH versus SA & SB)" http://www.allegromicro.com/en/Products/Design/packaging_advances/index.asp, Copyright 2008, pp. 1-5.

Frick, et al.; "CMOS Microsystem for AC Current Measurement with Galvanic Isolation;" IEEE Sensors Journal; vol. 3, No. 6; Dec. 2003; pp. 752-760.

"Gear-Tooth Sensor for Automotive Applications," Allegro Microsystems, Inc., Aug. 3, 2001.

Halg; "Piezo-Hall Coefficients of n-Type Silicon;" Journal of Applied Physics; vol. 64, No. 1; Jul. 1, 1988; pp. 276-282.

Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.

Hosticka; "CMOS Sensor Systems;" Sensors and Actuators A66; Apr. 1998; pp. 335-341.

Infineon Product Brief, TLE 4941plusC, Differential Hall IC for Wheel Speed Sensing, Oct. 2010, www.infineon.com/sensors, 2 pages.

Johnson et al., "Hybrid Hall Effect Device," Appl. Phys. Lett., vol. 71, Aug. 1997, pp. 974-976.

Kanda et el.; "The Piezo-Hall Effect in n-Silicon;" $22^{nd}$ International Conference on the Physics of Semiconductors; vol. 1, Jan. 1995; pp. 89-92.

Krammerer et al.: "A Hall effect sensors network insensitive to mechanical stress;" Proceedings of IEEE Sensors; vol. 3, Oct. 2004; pp. 1071-1074.

Lagorce et al.; "Magnetic and Mechanical Properties of Micromachined Strontium Ferrite/Polyimide Composites;" Journal of Microelectromechanical Systems; vol. 6, No. 4; Dec. 1997; pp. 307-312.

Lequesne et al.; "High-Accuracy Magnetic Position Encoder Concept;" IEEE Transactions on Industry Applications; vol. 35, No. 3; May/Jun. 1999; pp. 568-576.

Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.

Manic et al.; "Short and Long-Term Stability Problems of Hall Plates in Plastic Packaging;" IEEE $38^{th}$ Annual International Reliability Physics Symposium; Apr. 2000; pp. 225-230.

Manic; "Drift in Silicon Integrated Sensors and Circuits Due to the Thermo-Mechanical Stresses;" Lausanne, École Polytechnique Fédérale De Lausanne 2000; 176 pages.

Melexis Microelectronic Systems, Hall Applications Guide, Section 3—Applications, 1997 (48 pages).

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.

Motz et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Munter; "A Low-offset Spinning-current Hall Plate;" Sensors and Actuators A21-A23; 1990; pp. 742-746.

Munter; "Electronic Circuitry for a Smart Spinning-current Hall Plate with Low Offset;" Sensors and Actuators A; Jun. 1991;.pp. 747-751.

Oniku et al., "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Preprint of MEMS 2012 Conf. Paper, 4 pages.

Park et al.; "Ferrite-Based Integrated Planar Inductors and Transformers Fabricated at Low Temperature;" IEEE Transactions on Magnetics; vol. 33, No. 5; Sep. 1997; pp. 3322-3324.

Partin et al.; "Temperature Stable Hall Effect Sensors;" IEEE Sensors Journal, vol. 6, No. 1; Feb. 2006; pp. 106-110.

Pastre, et al.; "A Hall Sensor Analog Front End for Current Measurement with Continuous Gain Calibration;" IEEE Sensors Journal; vol. 7, No. 5; May 2007; pp. 860-867.

Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.

Popovic; "Sensor Microsystems;" Proc. $20^{th}$ International Conference on Microelectronics (MWIL 95); vol. 2, NIS, Serbia, Sep. 12-14, 1995; pp. 531-537.

Randhawa; "Monolithic Integrated Hall Devices in Silicon Circuits;" Microelectronics Journal; vol. 12, No. 6; Sep. 14-17, 1981; pp. 24-29.

Ruther et al.; "Integrated CMOS-Based Sensor Array for Mechanical Stress Mapping;" $5^{th}$ IEEE Conference on Sensors, Oct. 2007; pp. 1131-1134.

Ruther et al.; "Theromagnetic Residual Offset in Integrated Hall Plates;" IEEE Sensors Journal; vol. 3, No. 6; Dec. 2003; pp. 693-699.

Sargent; "Switched-capacitor IC controls feedback loop;" EDN; Design Ideas; Feb. 17, 2000; pp. 154 and 156.

Schneider, et al.; "Temperature Calibration of CMOS Magnetic Vector Probe for Contactless Angle Measurement System;" IEDM; Dec. 1996; pp. 533-536.

Schott et al.; "Linearizing Integrated Hall Devices;" 1997 International Conference on Solid-State Sensors and Actuators, Jun. 16-19, 1997; pp. 393-396.

Schott, et al.; "CMOS Single-Chip Electronic Compass with Microcontroller;" IEEE Journal of Solid-State Circuits; vol. 42, No. 12; Dec. 2007; pp. 2923-2933.

Simon et al.; "Autocalibration of Silicon Hall Devices;" $8^{th}$ International Conference on Solid-State Sensors and Actuators; vol. 2; Jun. 25, 1995; pp. 237-240.

Steiner et al.; "Double-Hall Sensor with Self-Compensated Offset;" International Electron Devices Meeting; Dec. 7, 1997; ISBN: 0-7803-4100-7; pp. 911-914.

Steiner et al; Offset Reduction in Hall Devices by Continuous Spinning Current Method; Sensors and Actuators A66; 1998; pp. 167-172.

Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.

Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.

Trontelj et al; "CMOS Integrated Magnetic Field Source Used as a Reference in Magnetic Field Sensors on Common Substrate;" WEP 1-6; IMTC; May 1994; pp. 461-463.

Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.

Zou et al.; "Three-Dimensionas Die Surface Stress Measurements in Delaminated and Non-Delaminated Plastic Packages;" 48th Electronic Components and Technology Conference; May 25, 1998; pp. 1223-1234.

U.S. Appl. No. 13/438,478, filed May 10, 2012, Pepka et al.

Smith et al.; "Low Magnetic Field Sensing with GMR Sensors;" Sensor Magazine; Part 1; Sep. 1999; http://archives.sensorsmag.com/articles/0999/76mail.shtml; pp. 1-8.

Smith et al.; "Low Magnetic Field Sensing with GMR Sensors;" Sensor Magazine; Part 2; Oct. 1999; http://archives.sensorsmag.com/articles/1099/84/mail.shtml; pp. 1-11.

Park et al.: "Batch-Fabricated Microinductors with Electroplated Magnetically Anisotropic and Laminated Alloy Cores", IEEE Transactions on Magnetics, vol. 35, No. 5, Sep. 1999, 10 pages.

(56) References Cited

OTHER PUBLICATIONS

U.S. Appl. No. 13/438,478 Office Action dated Jan. 15, 2014, 36 pages.
U.S. Appl. No. 13/438,478 Amendment as filed Jun. 12, 2014, 11 pages.
U.S. Appl. No. 13/438,478 Final Office Action dated Jul. 17, 2014, 13 pages.
U.S. Appl. No. 13/438,478 RCE and Response as filed Jan. 19, 2015, 15 pages.
U.S. Appl. No. 13/438,478 Office Action dated Feb. 12, 2015, 14 pages.
Notification of Transmittal of the International Search Report and the Written Opinion of the International Searching Authority, or the Declaration, PCT/US2013/037065, dated Jul. 17, 2013, 4 pages.
Written Opinion of the International Searching Authority, PCT/US2013/037065, dated Jul. 17, 2013, 9 pages.
Notification Concerning Transmittal of International Preliminary Report on Patentability (Chapter 1 of the Patent Cooperation Treaty), PCT/US2013/037065, dated Nov. 20, 2014, 2 pages.
Written Opinion of the International Searching Authority, PCT/US2013/037065, dated Nov. 20, 2014, 9 pages.
PCT International Preliminary Report on Patentablility and Written Opinion of the ISA dated Sep. 24, 2015; For PCT Pat. App. No. PCT/US2014/018209; 14 pages.
U.S. Appl. No. 13/468,478 Response to Final Office Action filed Jan. 14, 2016, 18 pages.
U.S. Appl. No. 13/468,478 Request for Continued Examination filed Jan. 14, 2016, 3 pages.
U.S. Office Action dated May 10, 2016 corresponding to U.S. Appl. No. 13/468,478; 20 Pages.
European Communication under Rule 71(3) EPC, Intention to Grant dated Jun. 2, 2016 corresponding to European Application No. 13722619.7; 7 Pages.
U.S. Appl. No. 13/468,478 Final Office Action dated Sep. 16, 2015, 19 pages.
Response filed Jun. 16, 2015; to Office Action dated Feb. 12, 2015; for U.S. Appl. No. 13/468,478; 11 pages.
Decision to Grant dated Oct. 27, 2016; for European Pat. App. No. 13722619.7; 2 pages.
European Extended Search Report dated Dec. 22, 2016; for European Pat. App. No. 16193227.2; 11 pages.
Response filed Oct. 3, 2016 to the Office Action dated May 10, 2016; for U.S. Appl. No. 13/468,478; 17 pages.
European Patent Application No. 14708772.0 Response to Office Action filed on Jul. 28, 2016, 30 pages.
Response (with Amended Claims in English) to Japanese Office Action dated Feb. 13, 2017 for Japanese Application No. 2015-511491; Response filed on Apr. 11, 2017; 9 Pages.
Notice of Allowance dated May 15, 2017 for U.S. Appl. No. 13/468,478; 15 Pages.
Request for Continued Examination for U.S. Appl. No. 13/468,478, filed Jun. 5, 2017; 3 Pages.
Japanese Office Action (with English Translation) dated May 18, 2017 for Japanese Application No. 2015-511491; 8 Pages.
Japanese Office Action (with English Translation) dated Jan. 13, 2017 for Japanese Application No. 2015-511491; 11 Pages.
U.S. Final Office Action dated Feb. 10, 2017 for U.S. Appl. No. 13/468,478; 27 Pages.
Response to U.S. Final Office Action dated Feb. 10, 2017 for U.S. Appl. No. 13/468,478; Response filed May 3, 2017; 9 Pages.
Response to Japanese Office Action dated Oct. 2, 2017 corresponding with Japanese Appl. No. 2016-500374; Response (with English set of Claims) filed Dec. 25, 2017; 15 Pages.
Korean Office Action (with English Translation) dated Dec. 20, 2017 corresponding to Korean Appl. No. 10-2014-7032857; 14 Pages.
U.S. Non-Final Office Action dated Jan. 9, 2018 corresponding to U.S. Appl. No. 15/709,739; 12 Pages.
Appeal Brief dated Sep. 19, 2017 from Japanese Application No. 2015-511491 with English translations; 14 Pages.
Pre-Trial Report dated Nov. 2, 2017 from Japanese Application No. 2015-511491 with English translations and Claims on File; 7 Pages.
U.S. Appl. No. 15/709,739, filed Sep. 20, 2017, Pepka et al.
Response to Official Communication dated Mar. 13, 2017 for European Application No. 16193227.2; Response filed Oct. 2, 2017; 7 Pages.
Japanese Office Action with English translation dated May 18, 2017 for Japanese Application No. 2015-511491, 5 pages.
Japanese Petition (with Machine English Translation) filed Jan. 24, 2018 for Japanese Application No. 2015-511491; 10 Pages.
Response (with English Translation) to Korean Notice of Reasons for Refusal dated Dec. 20, 2017 for Korean Application No. 10-2014-7032857; Response filed Feb. 14, 2018; 47 Pages.
Japanese Office Action (with English Translation) dated May 16, 2018 for Japanese Application No. 2015-511491; 6 Pages.
Japanese Office Action (with English Translation) dated May 24, 2018 for Japanese Application No. 2016-500374; 7 Pages.
Response to U.S. Non-Final Office Action dated Jan. 9, 2018 for U.S. Appl. No. 15/709,739; Response filed Jun. 25, 2018; 11 pages.
Korean Notice of Allowance (with English translation and allowed claims) dated Jun. 29, 2018 for Korean Application No. 10-2014-7032857; 8 pages.
Final Office Action dated Oct. 25, 2018 for U.S. Appl. No. 15/709,739; 14 Pages.
Japanese Office Action with English Translations for Japanese Application No. 2017-178549 dated Jul. 30, 2018; 4 Pages.
U.S. Non-Final Office Action dated Mar. 8, 2019 for U.S. Appl. No. 15/709,739; 15 Pages.
Non-Final Office Action dated Mar. 8, 2019 for U.S. Appl. No. 15/709,739; 15 Pages.
Response filed on Mar. 14, 2019 for Japanese Application No. 2015-511491 with English Machine Translation; 12 Pages.
Response to Final Office Action dated Oct. 25, 2018 for U.S. Appl. No. 15/709,739, filed Jan. 18, 2019; 10 Pages.
Japanese Notice of Allowance (with English Translation of Allowed Claims) dated May 16, 2019 for Japanese Application No. 2015-511491; 6 Pages.
Response to U.S. Non-Final Office Action dated Mar. 8, 2019 for U.S. Appl. No. 15/709,739; Response filed Jun. 10, 2019; 15 Pages.
Notice of Allowance dated Apr. 16, 2019 for Japanese Application No. 2017-178549 with English Translation of Allowed claims; 8 Pages.
U.S. Final Office Action dated Sep. 19, 2019 for U.S. Appl. No. 15/709,739; 24 Pages.
Korean Office Action (with English Translation) dated Sep. 18, 2019 for Korean Application No. 10-2015-7029243; 14 Pages.
European Examination Report dated Jun. 14, 2019 for European Application No. 14708772.0; 8 Pages.
Japanese Notice of Allowance (with Reporting Letter and Allowed Claims in English) dated Feb. 27, 2019 for Japanese Application No. 2016-500374; 9 Pages.
Response to European 161/162 Communication dated Nov. 19, 2014 for European Application No. 13722619.7; Response filed May 21, 2015; 15 Pages.
Appeal Brief (with Machine English Translation) filed on Sep. 19, 2017 for Japanese Application No. 2015-511491; 14 Pages.
Japanese Pre-Trial Report (with English Translation and Claims) dated Nov. 2, 2017 for Japanese Application No. 2015-511491; 7 Pages.
Response (with Machine English Translation) to $3^{rd}$ Japanese Office Action dated May 16, 2018 for Japanese Application No. 2015-511491; Response filed Nov. 14, 2018; 11 Pages.
$4^{th}$ Japanese Office Action (with English Translation) dated Dec. 17, 2018 for Japanese Application No. 2015-511491; 10 Pages.
Response (with Machine English Translation) to Japanese Office Action dated Aug. 2, 2018 for Japanese Application No. 2017-178549; Response filed Nov. 14, 2018; 13 Pages.
Response (with Machine English Translation) to $2^{nd}$ Japanese Office Action dated May 24, 2018 for Japanese Application No. 2016-500374; Response filed Nov. 22, 2018; 10 Pages.
Response (with Machine English Translation) to Korean Office Action dated Sep. 18, 2019 for Korean Application No. 10-2015-7029243; Response filed Nov. 15, 2019; 41 Pages.

(56) References Cited

OTHER PUBLICATIONS

Korean 2$^{nd}$ Office Action (with Machine English Translation) dated Feb. 24, 2020 for Korean Application No. 10-2015-7029243; 12 Pages.
Response to European Examination Report dated Jun. 14, 2019 for European Application No. 14708772.0; Response filed Dec. 12, 2019; 7 Pages.
Appeal Brief filed Mar. 19, 2020 for U.S. Appl. No. 15/709,739; 18 Pages.
Response (with Machine English Translation) to Korean 2$^{nd}$ Office Action dated Feb. 24, 2020 for Korean Application No. 10-2015-7029243; Response filed Apr. 22, 2020; 29 pages.
European Examination Report dated May 15, 2020 for European Application No. 16193227.2; 8 pages.

* cited by examiner

METHODS AND APPARATUS FOR MAGNETIC SENSOR HAVING AN EXTERNALLY ACCESSIBLE COIL

BACKGROUND

As known in the art, there are many safety critical applications for magnetic sensor integrated circuits (ICs). There are a variety of specifications directed to improving functional safety and achieving higher overall quality levels and lower field failure rates. For example, test modes for major functional parameters of an IC allow customers to implement test functionality prior to insertion on a printed circuit board, for example. However, after installation in a system or subsystem, such as an automobile, there are limited test opportunities to ensure that components are operating properly.

SUMMARY

In one aspect of the invention, a magnetic field sensor comprises: a sensing element, an analog circuit path coupled to the sensing element for generating an output voltage proportional to a magnetic field applied to the sensing element, and a coil in proximity to the sensing element, the coil having a first terminal that is accessible external to the magnetic field sensor.

The magnetic field sensor can further include one or more of the following features: the sensing element comprises a magnetic sensing element, the magnetic sensing element comprises a Hall element, the magnetic sensing element comprises a magnetoresistance element, the integrated circuit comprises a linear current sensor, the magnetic field sensor comprises a closed loop magnetic sensor, the coil is located on an opposite side of the lead frame from the die and enclosed in an over molded package, and/or the coil is located on the opposite side of the lead frame from the die and enclosed in a housing.

In another aspect of the invention, a magnetic field sensor comprises: a lead frame having a first surface and a second opposing surface, a semiconductor die having a first surface in which a magnetic field sensing element is disposed and a second opposing surface attached to the first surface of the lead frame, a non-conductive mold material enclosing the die and at least a portion of the lead frame, and a conductive coil secured to the non-conductive mold material, wherein the coil has at least one terminal to provide a connection external to the magnetic field sensor.

The sensor can further include one or more of the following features: the non-conductive mold material encloses the coil, a second mold material, the second mold material is ferromagnetic, and/or a housing encloses said coil.

BRIEF DESCRIPTION OF THE DRAWINGS

The foregoing features of this invention, as well as the invention itself, may be more fully understood from the following description of the drawings in which:

FIG. 33 is a cross-sectional view of the sensor of FIG. 3 taken along line B-B;

DETAILED DESCRIPTION

Exemplary embodiments of the invention provide a magnetic field sensor with external control of an on chip coil for generating a magnetic field for diagnostic/self test functionality, calibration, and/or back bias applications. In some embodiments, such conductive coils are formed on the semiconductor die itself. With this arrangement, a user can control a signal on the coil to meet the needs of a particular application. While exemplary embodiments of the invention are shown and described as having particular configurations, elements, and functions, it is understood that embodiments of the invention are applicable to magnetic field sensors in general in which external control of an internal coil is desirable.

In one aspect of the invention, magnetic sensor provides external control of an on chip coil to enable self-testing of a device to improve functional safety levels. Access to the coil also facilitates the manufacture of a closed loop sensor without the need to procure and assemble a compensation coil into a finished assembly.

As is known in the art, IS026262 is a specification for automotive OEMs directed to improving functional safety and achieving higher overall quality levels and lower field failure rates. Providing test modes for functional parameters of an IC in accordance with exemplary embodiments of the invention allows users to implement testing procedures at various stages of manufacture and use, such as after installation in an automobile. Thus, an IC can be tested after installation to ensure proper functioning. Providing test modes also improves functional safety in safety critical applications, such as accelerator pedal positioning. For example, a linear Hall IC having test functionality in accordance with exemplary embodiments of the invention can communicate that the IC is operating properly through self-test processing, which improves the functional safety of the entire throttle system.

In additional embodiments, an on chip coil with externally accessible terminals allows users of the magnetic sensor ICs to apply diagnostic magnetic fields to the sensing element to verify proper operation of the IC on an as needed basis, for example. In one embodiment having a closed loop system, accuracy of the system is increased by nearly eliminating the effects of sensitivity drift over temperature.

In exemplary embodiments of the invention, an on-chip coil is used in a closed loop magnetic sensor.

Figure 1:
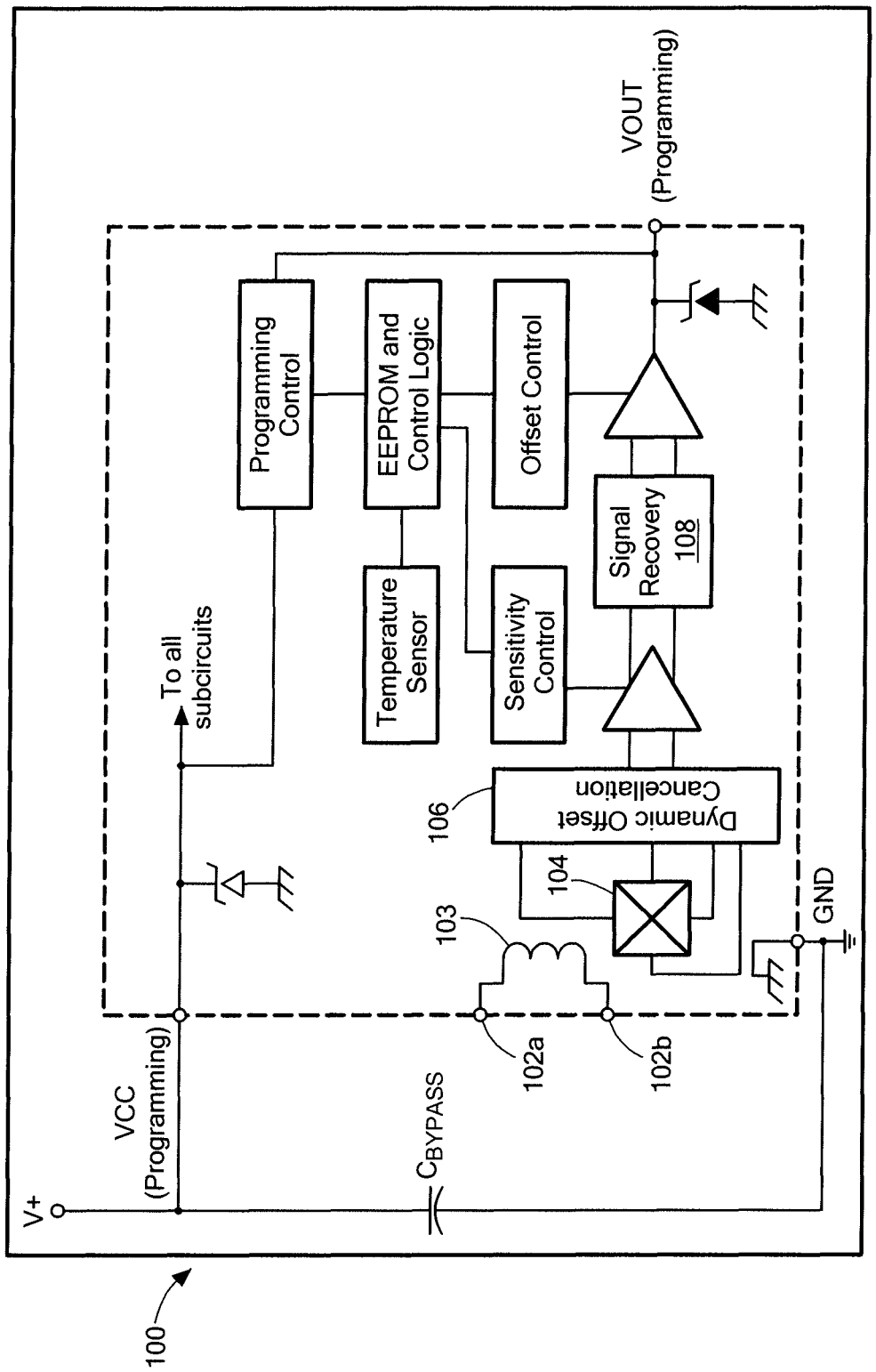
FIG. 1 is a schematic representation of a magnetic field sensor having a coil with an externally accessible terminal in accordance with exemplary embodiments of the invention.

FIG. 1 shows an exemplary sensor 100, shown as a current sensor linear device, having externally accessible terminals 102a,b for a coil 103 proximate a magnetic sensing element 104 in accordance with exemplary embodiments of the invention. The device 100 has an analog output voltage VOUT that is proportional to an applied magnetic field. In one embodiment, the device has a linear output that starts at Vcc/2 and swings in a more positive or negative direction depending on the polarity of the applied field. With this arrangement, a user can control a current through the coil 103 via the terminals 102a,b to stimulate the sensing element 104 for diagnostic testing.

The sensor IC senses current in a manner well known in the art. In general, a magnetic field sensing element, such as a Hall element 104, generates a voltage in response to an applied magnetic field. A dynamic offset cancellation module 106 'chops' the signal and a signal recovery module 108 provides an output signal. Exemplary current sensing is shown and described for example, in U.S. Pat. No. 7,923, 996, and U.S. Patent Publication No. US2011/001.8533, which are incorporated herein by reference. It is understood that other techiques can be used to meet the needs of a particular application.

Figure 1A:
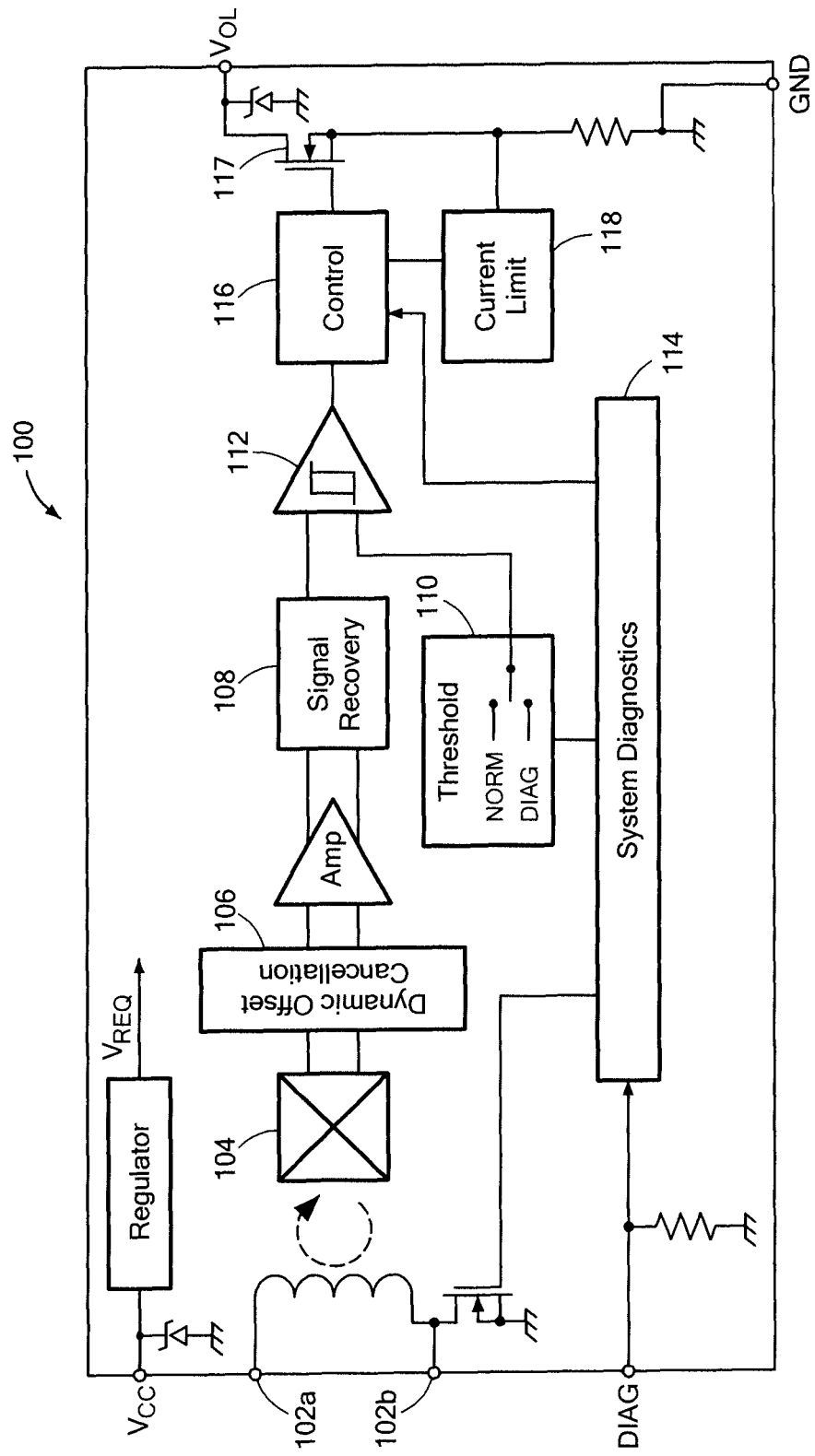
FIG. 1A is a schematic representation of a further magnetic field sensor having a coil with an externally accessible terminal in accordance with exemplary embodiments of the invention.

As shown in FIG. 1A, which has some commonality with FIG. 1, threshold module 110 can provide a reference voltage to a device 112 under the control of a diagnostic module 114. In the illustrative embodiment, the thresold module 110 can provide a normal operation threshold and a diagnostic threshold under the control of the diagnostic module 114. A control module 116 receives the output to control a switch 117 for generating the output voltage VOL. A current limit module 118 coupled to the control module 116 and the swtich 117.

The magnetic field sensing element 104 in this and other embodiments can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The sensing element 104 may include a single element or, alternatively, may include two or more elements arranged in various configurations, e.g., a half bridge or full (Wheatstone) bridge. Depending on the device type and other application requirements, the sensing element 104 may be a device made of a type IV semiconductor material such as Silicon (Si) or Germanium (Ge), or a type semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Exemplary embodiments of the invention are appliable to a variety of sensing applications having a range of sensing elements. Exemplary sensors include magnetic field, for example automotive speed and position sensors, current sensors, or package scale NMR devices for use in chemical or biological applications. Exemplary embodiments of the invention are applicable to a wide range of applications in which sensing magnetic fields generated by moving magnets or flowing current are desirable. For example, exemplary embodiments of the invention are useful for performing diagnostic functions for a device installed in an automobile in safety critical applications.

In safety critical applications it is desirable to improve the safety integrity level (SIL) of the sensor, such as by using self-test diagnostics. As described more fully below, in exemplary embodiments of the invention, the analog signal path of a sensor can be stimulated and evaluated. In one embodiment, output accuracy of the device over temperature can be enhanced.

Figure 2A:
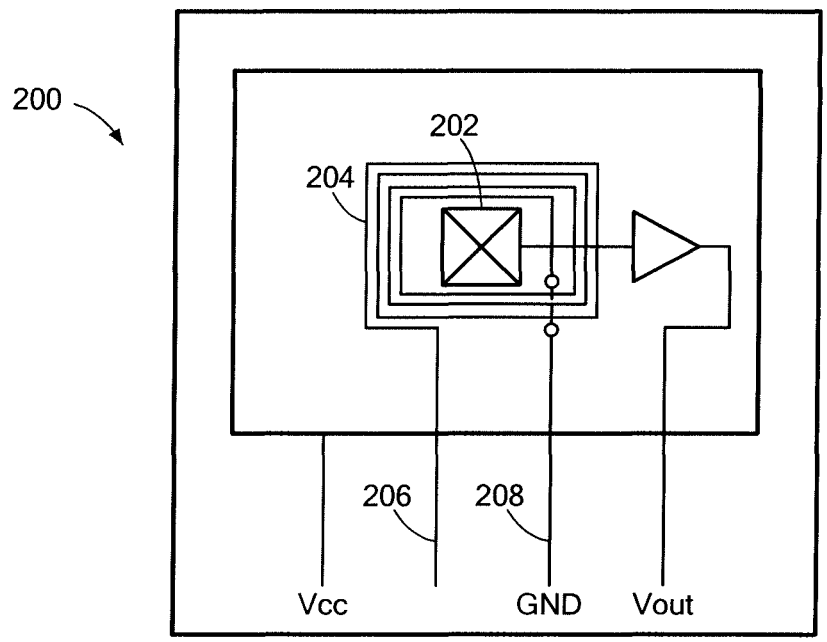
FIG. 2A is a partial schematic representation of a magnetic field sensor having a coil with one externally accessible terminal and another terminal coupled to ground.

FIG. 2A shows a sensor 200 including a sensing element 202, such as a Hall element, having a coil 204 wrapped around the sensing element, which generates an output voltage Vout that is proportional to a magnetic field on the sensing element. In one embodiment, the coil 204 is disposed around the Hall element 202 on the silicon. The coil 204 has a first terminal 206 that is externally accessible to allow connection to any suitable signal generator. In the illustrated embodiment of FIG. 2A, a second terminal 208 of the coil is coupled to ground. In the alternate embodiment shown in FIG. 2B, the second terminal 208' is externally controllable.

Figure 2B:
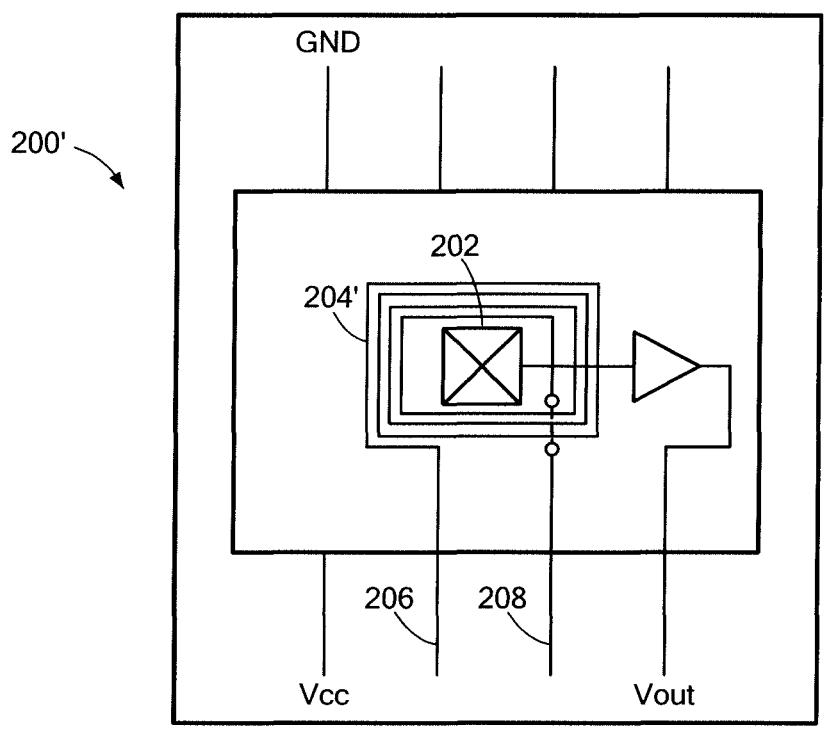
FIG. 2B is a partial schematic representation of a magnetic field sensor having a coil with externally accessible terminals.

FIGS. 2A and 2B are shown as a Single In-line Package (SIP) with four leads with the coil taking one additional pin. If the user can drive positive and negative currents into this single pin then they will not require a device with access to both pins. One pin can be tied to GND, as shown in FIG. 2A. If two pins are used for coil stimulation, as in FIG. 2B, then the user can drive currents in either direction with a single source by switching the connections of the terminals.

Figure 2C:
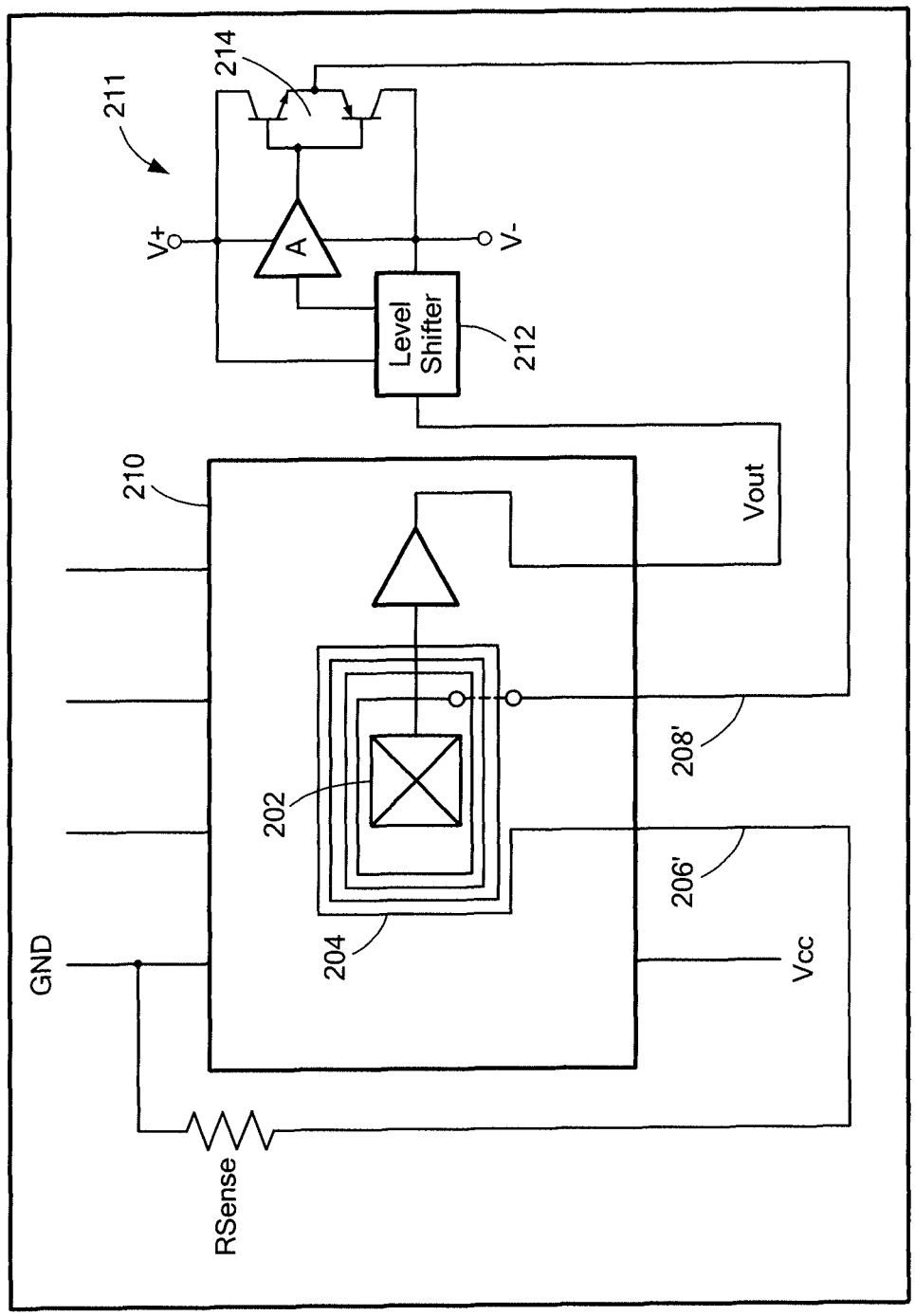
FIG. 2C is a partial schematic representation of a magnetic field sensor having a closed loop and an externally accessible terminal.

FIG. 2C shows an exemplary closed loop magnetic sensor 210 with a user-test circuit 211 attached. The analog output is fed into an amplifier circuit with supply voltages. The sensor output can be fed into a level shifter 212 and amplifier 214 in the user-test circuit 211 and then connected to the coil 204 on the device. In this way the amplifier 214 can apply a cancellation of the incident magnetic field generated by the application. It is understood that a wide variety of user-test circuits well known to one of ordinary skill in the art can be used. Exemplary applications for such a device include a moving magnet and a current flowing in a conductor that generates a magnetic field.

Current in the coil 204 stimulates the Hall element 202 at the front end of the sensing circuitry when current flows through the coil by generating a magnetic field. With this arrangement, the entire analog signal path can be tested.

By providing external control over the coil 204, the analog signal path programmed sensitivity can be analyzed by the end user very accurately. By applying a constant current through the coil 204, the magnetic field generated by the coil is fixed. This fixed magnetic field causes a deflection on the output of the analog output proportional to the gain of the analog signal path. Since the gain of the device is programmable and the coil is defined, the device can provide an accurate measurement of the analog signal path by the end user detecting the change in output voltage or output current in response to the applied coil stimulus or current.

Since a user can control the signal on the coil, certain failure modes can be forced to check for detection. In addition, the offset of the device in the offset cancellation module 106 can also be tested. Since the zero gauss field analog output voltage is programmed, the zero field output signal as well as the signal path gain can be self-tested with high accuracy. If it were to drift for some reason, the drift can be identified during the user-test.

With external control of the coil, a user can exercise the device to meet the needs of a particular application. For example, some users may want to do a quick functional check and other users may want to determine whether the sensitivity of the device is within some specified window.

It is understood that the ability to control a coil in a magnetic sensor is desirable for various applications. Coils are used in magnetic field sensors for various reasons, for example to generate a magnetic field for diagnostic or self test functionality as described above and in a U.S. Patent Application No. 2010/00211347, for calibration as is described in a U.S. Pat. No. 8,030,918, and/or for resetting a GMR magnetic field sensing element as described in a U.S. Pat. No. 8,063,634, each of which is assigned to the Assignee of the subject application and incorporated herein by reference in its entirety. In many instances, such conductive coils are formed on the semiconductor die itself.

In another aspect of the invention, a magnetic field sensor includes a coil with externally accessible terminals that functions as a back bias magnet, so as to provide a magnetic field which can be used to detect movement of a proximate target.

Figure 3:
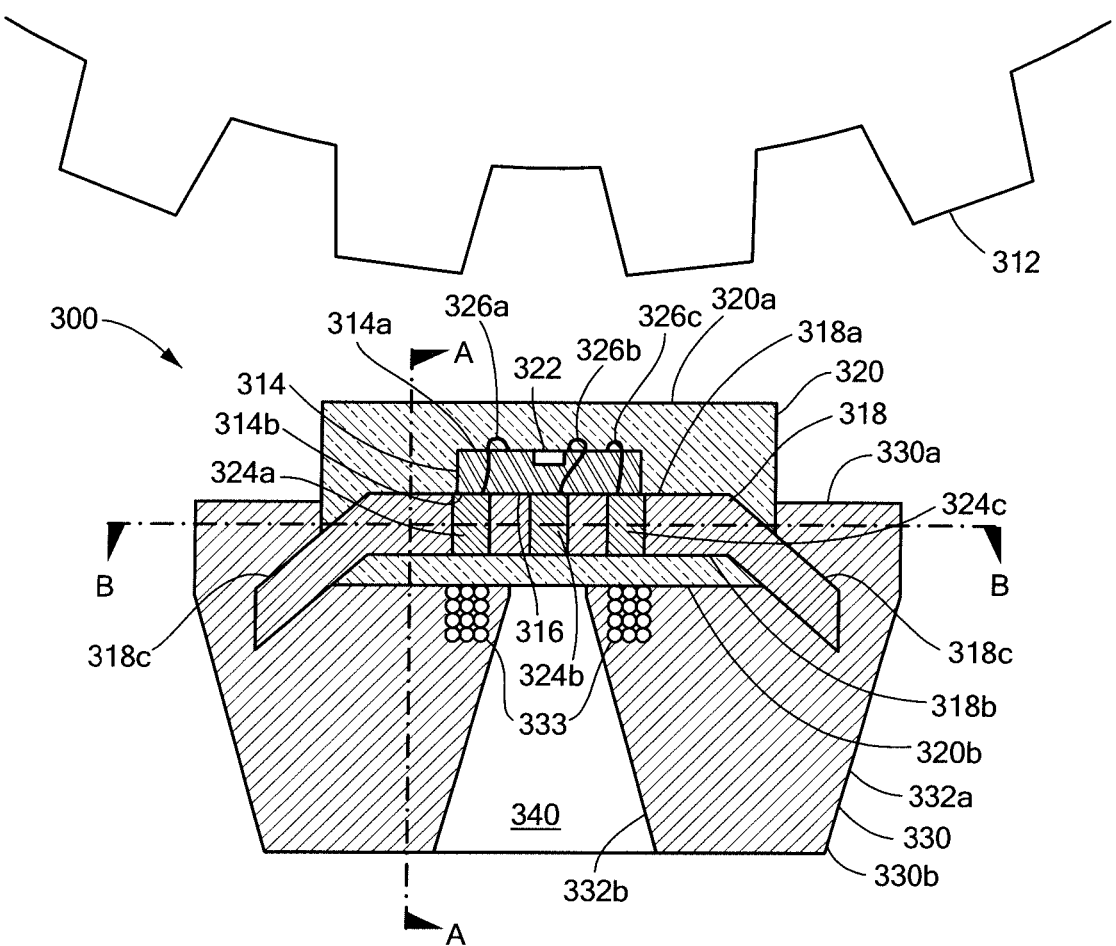
FIG. 3 is a cross-sectional view of a magnetic field sensor having a coil with an externally accessible terminal.
Figure 3A:
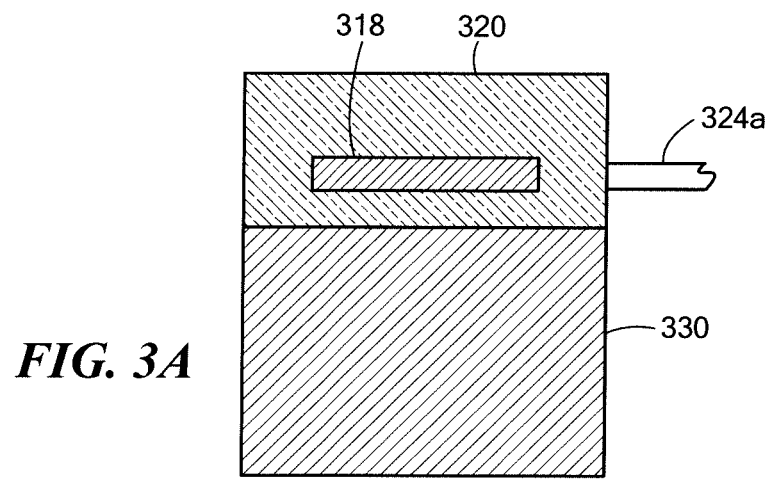
FIG. 3A is a cross-sectional view of the sensor of FIG. 3 taken along line A-A.
Figure 3B:
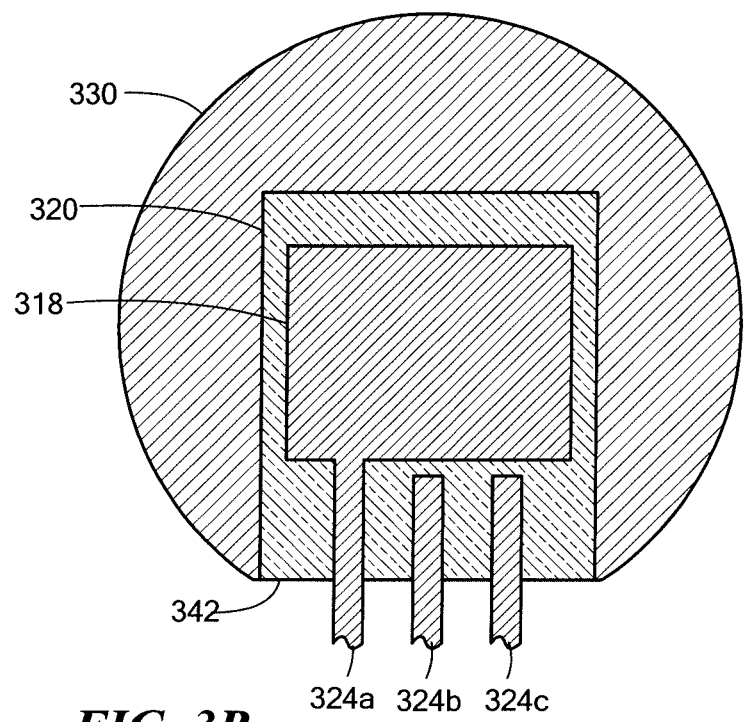
FIG. 3C is an alternative cross-sectional view of the sensor of FIG. 3 taken along line B-B

Referring to the cross-sectional view of FIG. 3, and also to the cross-sectional views of FIGS. 3A and 3B, a magnetic field sensor 300 includes a semiconductor die 314 having a first, active surface 314a in which a magnetic field sensing element or transducer 322 is formed and a second, opposing surface 314b attached to a die attach area 316 on a first surface 318a of a lead frame 318, a non-conductive mold material 320 enclosing the die and at least a portion of the lead frame, and a ferromagnetic mold material 330 secured to the non-conductive mold material. The ferromagnetic mold material 330 comprises a ferromagnetic material and is tapered from a first end 330a proximate to the lead frame 318 to a second end 330b distal from the lead frame. A coil 333 is disposed in proximity to the magnet field sensing element 322, as described more fully below. The active die surface 314a is opposite the die surface 314b which is attached to the die attach area 316 and thus, this configuration may be referred to as a "die up" arrangement. In other embodiments the die may be flip-chip attached or lead on chip attached, for example.

In use, the magnetic field sensor 300 like the other sensor embodiments described herein may be positioned in proximity to a moveable magnetically permeable ferromagnetic article, or target, such as the illustrated gear 312, such that the magnetic field transducer 322 is adjacent to the article 312 and is thereby exposed to a magnetic field altered by movement of the article. The magnetic field transducer 322 generates a magnetic field signal proportional to the magnetic field.

While the magnetic field sensor 300 in FIG. 3 is oriented relative to the target 312 such that the transducer 322 is closer to the target than the ferromagnetic mold material 330, it will be appreciated that it may be desirable in certain applications to rotate the sensor 300 by 180° so that the ferromagnetic mold material is closer to the target than the transducer. Also, the sensor 300 may be rotated by 90° so that the major face of the transducer is orthogonal to the target, thereby achieving a different type of magnetically sensitive sensor, as may be desirable when the transducer is a magnetoresistance element for example.

The ferromagnetic article 312 may be comprised of a hard ferromagnetic, or simply hard magnetic material (i.e., a permanent magnet such as a segmented ring magnet), a soft ferromagnetic material, or even an electromagnet and embodiments described herein may be used in conjunction with any such article arrangement.

In embodiments in which the article 312 is comprised of a soft ferromagnetic material, the ferromagnetic mold material 330 is comprised of a hard ferromagnetic material to form a bias magnet; whereas in embodiments in which the article 312 is comprised of a hard ferromagnetic material, the ferromagnetic mold material 330 may be soft ferromagnetic material to form a concentrator, or a hard magnetic material where a bias field is desired (for example, in the case of a magnetoresistance element that is biased with a hard magnetic material or permanent magnet). In other embodiments the mold material 330 may be a nonconductive and non ferromagnetic mold material similar to the material for the first mold element 320. In embodiments in which the ferromagnetic mold material 330 comprises a hard ferromagnetic material to form a bias magnet and in which the sensor 300 is oriented relative to the target such that transducer 322 is closer to the target than the ferromagnetic mold material 330 as shown, the bias magnet may be referred to as a back bias magnet.

The magnetic field sensor 300 generally includes additional circuitry formed in the active surface 314a of the die 314 for processing the magnetic field signal provided by the transducer 322. The lead frame 318 includes leads 324a-324c for coupling the circuitry to system components (not shown), such as a power source or microcontroller. Electrical connection between the leads 324a-324c and the semiconductor die 314 can be provided with wire bonds 326a-326e, respectively as shown. While the sensor 300 is shown to include three leads 324a-324c, it will be appreciated by those of ordinary skill in the art that various numbers of leads are possible. Other techniques for electrically coupling the lead frame leads to the sensor components include solder bumps or balls or pillar bumps.

The integrated circuit sensor 300 may be provided in the form of a two to six pin Single In-Line (SIP) package, or some other number of pins as appropriate. The die attach area 316 on the first surface 318a of a lead frame 318 is generally a dedicated area of the conductive lead frame to accept the semiconductor die 314. The die attach area 316 is sometimes referred to as a die attach paddle or a die attach pad and in some embodiments the die attach pad may be a silver plated or a NiPdAu area for example. Alternatively, as described in a co-pending U.S. patent application Ser. No. 13/350,970 entitled "Methods and Apparatus for a Magnetic Sensor having a Non-conductive Die Paddle" which was filed on Jan. 16, 2012 and assigned to the Assignee of the subject application, it may be desirable to form the die attach area with a non-conductive material, particularly in applications where Eddy currents can occur. Conventional techniques for securing the die 314 to the die attach area 316 include the use of adhesives, such as epoxy or an adhesive tape. It will be appreciated by those of ordinary skill in the art that the die attach area may or may not be a contiguous area.

The non-conductive mold material 320 is comprised of a non-conductive material so as to electrically isolate and mechanically protect the die 314 and the enclosed portion of the lead frame 318. Suitable materials for the non-conductive mold material 320 include thermoset and thermoplastic mold compounds and other commercially available IC mold compounds. It will be appreciated that the non-conductive mold material 320 can contain a ferromagnetic material, such as in the form of ferromagnetic particles, as long as such material is non-conductive.

The non-conductive mold material 320 is applied to the lead frame/die subassembly to enclose the die 314 and a portion of the lead frame 318. The non-conductive mold material 320 has a first surface 320a and a second, opposing surface 320b. The shape and dimensions of the non-conductive mold material are selected to suit a particular IC package.

In some embodiments as noted above, the ferromagnetic mold material 330 is comprised of a hard or permanent magnetic material to form a bias magnet. As will be apparent to those of ordinary skill in the art, various materials are suitable for providing the ferromagnetic mold material 330 depending on the operating temperature range and final package size. In some embodiments, it may be desirable for the ferromagnetic mold material to have a coercivity larger than its remanence.

Illustrative hard magnetic materials for the ferromagnetic mold material include, but are not limited to hard magnetic ferrites, SmCo alloys, NdFeB alloy materials, or Plastiform® materials of Arnold Magnetic Technologies Corp., or other plastic compounds with hard magnetic particles, for example a thermoset polymer such as polyphenylene sulfide material (PPS) or nylon material containing SmCo, NdFeB, or hard ferromagnetic ferrite magnetic particles; or a thermoset polymer such as SUMIKON®EME of Sumitomo Bakelite Co., Ltd or similar type of thermoset mold material containing hard magnetic particles. In some embodiments it may be desirable to align the hard ferromagnetic particles during molding to form a more isotropic or directional permanent magnetic material by molding in the presence of a magnetic field; whereas, in other embodiments, a sufficient magnet may result without an alignment step during molding for isotropic materials. It will be appreciated that a NdFeB or a SmCo alloy may contain other elements to improve temperature performance, magnetic coercivity, or other magnetic properties useful to a magnetic design.

In other embodiments, the ferromagnetic mold material 330 is comprised of a soft ferromagnetic material to form a concentrator. As will be apparent to those of ordinary skill in the art, various materials are suitable for providing the ferromagnetic mold material 30 in the form of a soft ferromagnetic material. In some embodiments, it may be desirable for the soft ferromagnetic mold material to have a relatively low coercivity and high permeability. Suitable soft ferromagnetic materials include, but are not limited to permalloy, NiCo alloys, NiFe alloys, steel, nickel, and soft magnetic ferrites.

The ferromagnetic mold material 330 is secured to the non-conductive mold material 320. The ferromagnetic mold material contacts the second surface 320b of the non-conductive mold material and also a portion of the sides of the non-conductive mold material between the first and second surfaces 320a, 320b, as shown.

In some embodiments, a portion of the non-conductive mold material 320 that contacts the ferromagnetic mold material 330 and/or the portion of the ferromagnetic mold material that contacts the non-conductive mold material has a securing mechanism in order to improve the adhesion between the two materials and to prevent or reduce lateral slippage or shear between the materials. As one example, the lead frame 318 has extensions 318c which extend beyond the non-conductive mold material and are enclosed by the ferromagnetic mold material, as shown. Such lead frame extensions additionally enhance the adhesion of the ferromagnetic mold material to the lead frame itself. In such embodiments utilizing lead frame portions as a securing mechanism such that the ferromagnetic mold material contacts such lead frame portions, it will be appreciated that the ferromagnetic mold material should be non-conductive or have a sufficiently low conductivity to prevent the leads from electrically shorting resulting in the device not operating as intended. Alternative forms of securing mechanisms are shown in other embodiments.

As is shown in FIG. 3B, a portion of the leads 324a-324c is enclosed by the non-conductive mold material 320. The non-conductive mold material surrounds the leads out to the edge of the package in order to isolate the ferromagnetic mold material 330 from the leads (since the ferromagnetic mold material may be electrically conductive).

Figure 3C:
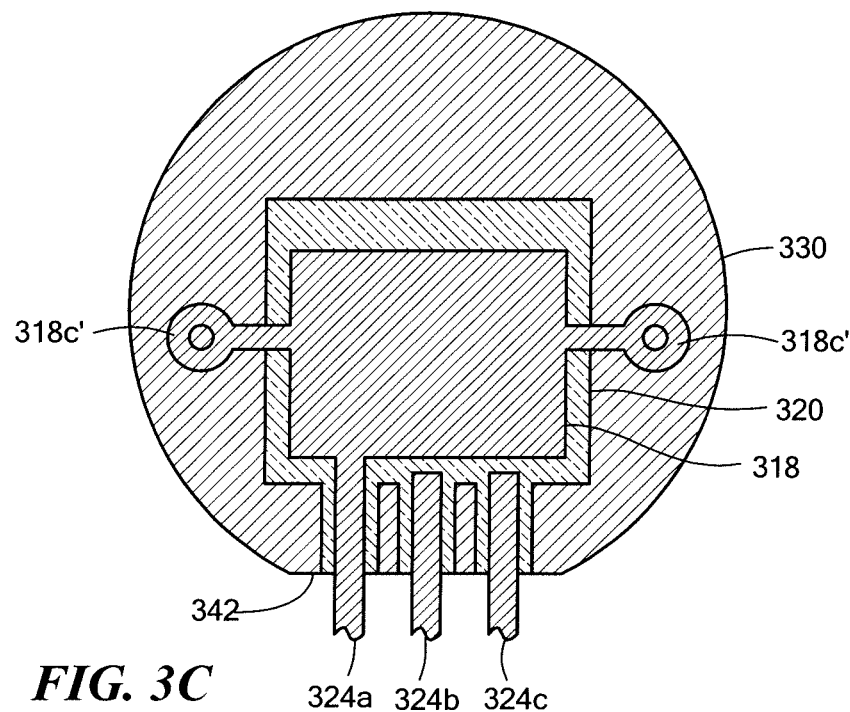

According to the alternative cross-sectional view of FIG. 3C, portions of the non-conductive mold material 320 adjacent to the leads 324a-324c may be "cut out" around the leads so as to follow the contours of the leads, as shown. This arrangement may be desirable in some applications for magnetic performance reasons, to thereby increase the amount of the hard ferromagnetic material of the ferromagnetic mold material in proximity to the transducer 322. Also shown in FIG. 3C is an alternative securing mechanism in the form of lead frame tabs 318c'. The tabs 318c' may be planar and may have an eye as shown. With this arrangement, the ferromagnetic mold material 330 flows through the eye of the tabs and around the tabs to improve the adhesion of the ferromagnetic mold material to the lead frame and non-conductive mold material.

The illustrative coil 33 on the other hand is positioned relative to the magnetic field sensing element 322 to function as a back bias magnet, so as to provide a magnetic field which can be used to detect movement of a proximate target. To this end, the coil 333 is positioned adjacent to the second surface 320b of the non-conductive mold material 320 so that the transducer 322 is closer to the target 312 than the coil 333, as shown. Here again, it will be appreciated that it may be desirable in certain applications to rotate the sensor by 180° so that the coil 333 is closer to the target than the transducer or to rotate the sensor by 90° so that the major face of the transducer is orthogonal to the target, thereby achieving a different type of magnetically sensitive sensor, as may be desirable when the transducer is a magnetoresistance element for example which has a different axis of sensing element sensitivity than a planar Hall element. It may also be desirable in an embodiment to rotate coil 333 such that its central axis is parallel to the surface of the die 314 for certain sensor configurations and sensing element combinations.

Various techniques and materials can be used to form the coil 333. For example, the coil can be formed from copper wire of various sizes and with various automated processes so as to provide an insulator between coil windings. The coil material selection, wire gauge selection, number of turns, and other design choices can be readily varied to suit a particular application so as to produce a magnetic field of a desired strength. The coil 333 may be formed so that each turn is in the shape of a circle, rectangle, or other shapes such as an oval, as desirable to suit a particular application and packaging arrangement.

The coil 333 may be secured to the second surface 320b of the non-conductive mold material 320 by various means. As one example, an adhesive, such as an epoxy, may be used to secure the coil in place. Once secured in place, the mold material 330 may be formed in the manner described above, such as by injection molding for example.

In operation, a bias current may be applied to the coil 333 which causes a bias magnetic field to be generated. The transducer 322 is responsive to perturbations in the magnetic field caused by movement of the target 312. It will be appreciated by those of ordinary skill in the art that the mold material 330 can be provided in the form of a hard ferromagnetic material, a soft ferromagnetic material, or even a non-conductive material. For example, in embodiments in which the material 330 is a soft ferromagnetic material, the magnetic field generated by the coil 333 can be focused or otherwise concentrated as desired by the soft ferromagnetic mold material 330. Alternatively, in embodiments in which the material 330 is a hard ferromagnetic material, the magnetic field provided by the coil 333 can be used to modulate the magnetic field provided by the hard ferromagnetic material 330, in order to thereby reduce the peak current otherwise required to provide the same peak value of magnetic field strength when compared to the case of the coil alone (i.e., if the hard ferromagnetic mold material 330 were not present). In another embodiment, a separately formed element may be disposed in the central aperture 340.

When checking the part the for proper operation, such as or safety integrity level (SIL) the current applied to the coil is changed, for example, by a change in the input current applied to the coil externally from the package. As noted above, the coil current can be controlled via connection to one or two (or more) external pins of the package. The change in output voltage of the part should change due to the change in magnetic field caused by the change of coil current. The output voltage changed can be monitored, such as by user-test circuitry (see FIG. 2C, for example) and evaluated for proper functionality. This operation works even if the coil is not used for a bias feature during operation of the part and with or without the ferromagnetic mold material.

In some embodiments, since the back bias functionality is provided by the coil, the mold material 330 may be eliminated entirely in which case the non-conductive mold material 320 with the coil 333 attached to its second surface 320b can be packaged to provide the resulting sensor IC. Such an arrangement can be provided in a package of the type described in a U.S. Pat. No. 6,265,865 or a U.S. Pat. No. 5,581,179, each of which is assigned to the Assignee of the subject application and incorporated herein by reference in its entirety.

Figure 4:
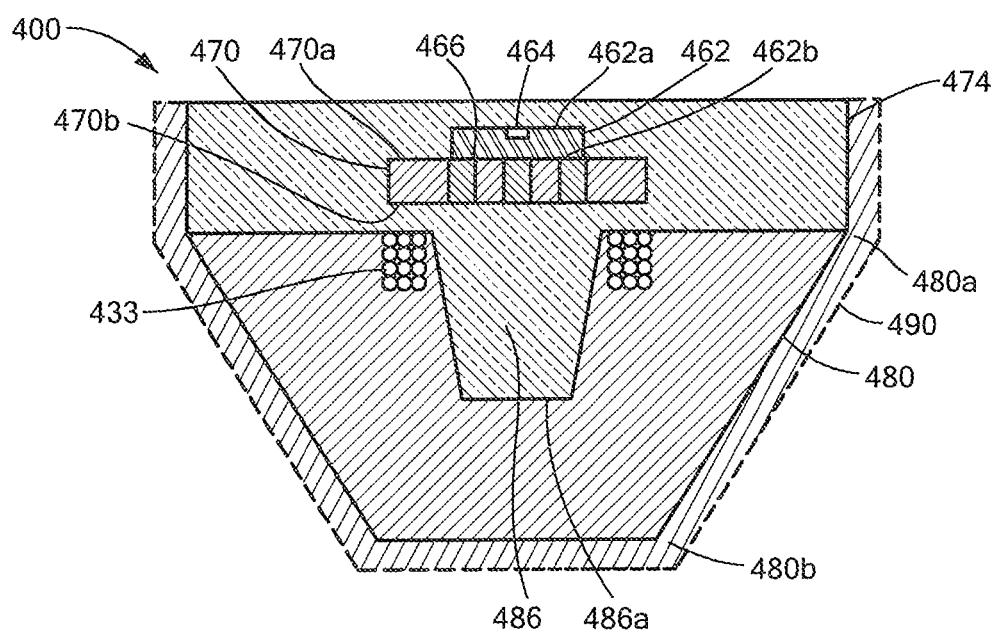
FIG. 4 is a cross sectional-view of a further magnetic sensor having a coil with an externally accessible terminal.

Referring now to FIG. 4 an alternative magnetic field sensor 400 includes a semiconductor die 462 having a first active surface 462a in which a magnetic field sensing element 464 is disposed and a second, opposing surface 462b attached to a die attach area 466 on a first surface 470a of a lead frame 470, a non-conductive mold material 474 enclosing the die and at least a portion of the lead frame, and a mold material 480 secured to a portion of the non-conductive mold material.

The non-conductive mold material 474 has a protrusion 486 extending away from a second surface 470b of the lead frame 470 as shown. The protrusion 486 may prevent there being a void in the bottom surface of the sensor 400 (adjacent to the second end 480b of the ferromagnetic mold material), since the presence of a void may make overmolding more difficult. It will be appreciated by those of ordinary skill in the art that the protrusion may extend all or only part of the way to the second end 480b of the mold material.

The sensor includes a coil 433 that may the same as or similar to the coil 333 of FIG. 3. Here, the coil 433 is positioned concentrically with respect to the protrusion 486 of the non-conductive mold material 474, although it will be appreciated that concentric positioning is not required. It will be appreciated that the taper to the protrusion 486 may be eliminated or altered as suitable for a particular application. Here again, the coil 433 may be secured to the mold material 474 by an adhesive. Alternatively however, the coil 433 may be sized and shaped to provide an interference fit with respect to the protrusion 486 such that adhesive is not necessary and the coil 433 may be sufficiently held in place relative to the mold material 474 by the interference fit when the subassembly, including the mold material 474, lead frame 470 and die 462, are placed into the mold cavity for formation of the mold material 480.

While the sensor 400 is shown to have a protrusion extending only partially through the mold material 480 to terminate before the second end 480b of the mold material, it will be appreciated that a similar sensor including a coil that may be (although is not required to be) concentrically disposed with respect to a protrusion of the non-conductive mold material can be provided with a protrusion extending to the second end 480b of the mold material 480.

In operation, a bias current may be applied to the coil 433 which causes a bias magnetic field to be generated. The transducer 464 is responsive to perturbations in the magnetic field caused by movement of a target. The bias current may be changed to cause a change in the output voltage at a known time in order to check the functionality of the package sensor by looking for a change in response of the output voltage. It will be appreciated by those of ordinary skill in the art that the mold material 480 can be provided in the form of a hard ferromagnetic material, a soft ferromagnetic material, or even a non-conductive material. For example, in embodiments in which the material 480 is a soft ferromagnetic material, the magnetic field generated by the coil 433 can be focused or otherwise concentrated as desired by the soft ferromagnetic mold material 480. Alternatively, in embodiments in which the material 480 is a hard ferromagnetic material, the magnetic field provided by the coil can be used to modulate the magnetic field provided by the hard ferromagnetic material 480, in order to thereby reduce the peak current otherwise required to provide the same magnetic field strength with just the coil (i.e., if the hard ferromagnetic mold material 480 were not present).

Figure 4A:
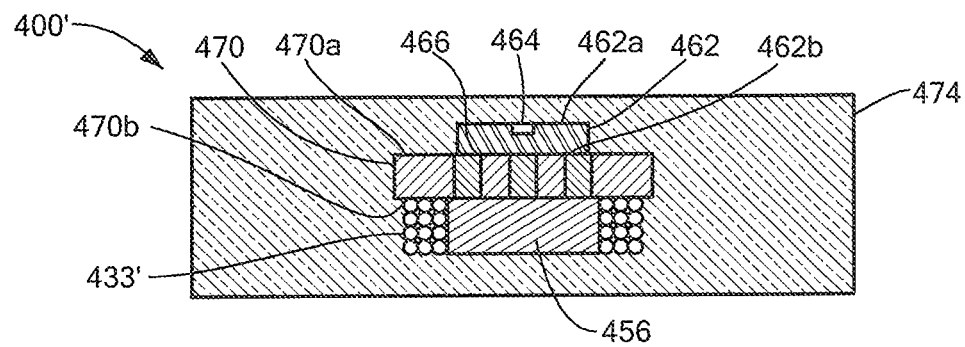
FIG. 4A is a cross sectional-view of another magnetic sensor having a coil with an externally accessible terminal.

Here again, since the back bias functionality is provided by the coil, the mold material 480 may be eliminated entirely (as is shown in FIG. 4A) in which case the non-conductive mold material 474 with the coil 433 attached to its surface can be packaged to provide the resulting sensor IC. Such an arrangement can be provided in a package of the type described in one of the above-referenced U.S. Patents.

In applications including the mold material 480, such mold material may be tapered from a first end 480a proximate to the lead frame 470 to a second end 480b distal from the lead frame and the sensor may, optionally, include a third mold material 490 in the form of an overmold in order to protect and electrically insulate the device. In another embodiment a housing 490 may be used as in U.S. Pat. Nos. 5,045,920 and 5,581,179, which are assigned to the assignee of the present invention and incorporated herein by reference. In such an embodiment, the third mold material may be replaced by the housing which is pre-molded and the welded to the plastic package, for example. In other embodiments the pre-molded, or otherwise manufactured, housing may be used in place of the second mold material where only the first and second mold versions are used, in such an embodiment the coil is enclosed by the pre-molded housing.

Referring to FIG. 4A an alternative magnetic field sensor 400' includes a semiconductor die 462 having a first active surface 462a in which a magnetic field sensing element 464 is disposed and a second, opposing surface 462b attached to a die attach area 466 on a first surface 470a of a lead frame 470 and a non-conductive mold material 474 enclosing the die and at least a portion of the lead frame.

The sensor includes a coil 433' that may the same as or similar to the coil 433 of FIG. 4. The coil 433' is secured to, and more particularly, in the embodiment of FIG. 4A is enclosed by, the non-conductive mold material 474. The wire of the coil 433' may be wound around a mandrel or bobbin 456, as shown. In one illustrative embodiment, the mandrel 456 may be comprised of a soft ferromagnetic material or aplastic and remain part of the final device. In other embodiments, the mandrel 456 is used during coil winding but then not made a part of the final package, for example in the case of FIGS. 3 and 4. The mandrel 456 and coil 433' may be secured to the surface 470b of the lead frame 470 that is opposite the die 462 with an adhesive or other securing mechanism, such that the coil is secured to the lead frame when the subassembly is placed in a mold cavity and the non-conductive mold material 74 is formed.

In operation, a bias current is applied to the coil 433' which causes a bias magnetic field to be generated and the transducer 464 is responsive to perturbations in the magnetic field caused by movement of a proximate target. The bias current may be changed to cause a change in the output voltage at a known time in order to check the functionality of the package sensor by looking for a change in response of the output voltage. While the ferromagnetic mold material is eliminated in the sensor 400' of FIG. 4A, it will be appreciated by those of ordinary skill in the art that a ferromagnetic mold material may be provided as explained in connection with any foregoing embodiments in order to concentrate the magnetic field generated by the coil (in the case of a soft ferromagnetic mold material) or to provide a magnetic field for modulation by a coil-generated magnetic field (in the case of a hard ferromagnetic mold material).

In another embodiment, the coil may be used to create a closed loop current sensor. In this embodiment the packaged magnetic field sensor and at least one coil inside the package (either on the die, in the package, or both), in any package form or style such as SIP, SOIC, QFN, or other package of interest, are connected externally to the package with a circuit. The user circuit applies a current to the coil inside the package (or on the die of the sensor) to maintain the output voltage of the sensor at a known voltage (or current for a current output device such as a "two-wire" part). This has the advantage of allowing higher current to be used in the coil, particularly for the case of the coils describe in FIGS. 4 and 4A, than would otherwise be typical for a magnetic field sensor.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A magnetic field sensor IC package, comprising:
   a semiconductor die having an active surface;
   a sensing element formed in the active surface of the semiconductor die;
   an analog circuit path including analog circuitry in the active surface of the semiconductor die coupled to the sensing element for generating an output voltage proportional to a magnetic field applied to the sensing element;
   a diagnostic IO pin coupled to a diagnostic module, which is coupled to a voltage IO pin, wherein the diagnostic module is coupled to a threshold module that provides a normal operation threshold corresponding to normal operation and a diagnostic threshold corresponding to diagnostic testing, wherein a switch controls the voltage IO pin;
   a coil in proximity to the sensing element and coupled to the diagnostic module, the coil having a first terminal that is accessible external to the magnetic field sensor IC package, wherein the coil is formed on the semiconductor die, wherein the coil is disposed proximate the sensing element on the semiconductor die, wherein a signal applied to the coil forces the magnetic field sensor IC package into a failure mode by a level of current of the signal applied to the coil during the diagnostic testing for verifying detection of the failure mode that was forced by the current level of the coil,
   wherein during the normal operation the output voltage from the sensing element is compared with the normal operation threshold and an output of the normal operation comparison is provided to the voltage IO pin, and wherein during the diagnostic testing the output voltage from the sensing element is compared to the diagnostic threshold and an output of the diagnostic testing comparison is provided to the voltage IO pin.

2. The magnetic field sensor according to claim 1, wherein the sensing element comprises a magnetic sensing element.

3. The magnetic field sensor according to claim 2, wherein the magnetic sensing element comprises a Hall element.

4. The magnetic field sensor according to claim 2, wherein the magnetic sensing element comprises a magnetoresistance element.

5. The magnetic field sensor according to claim 1, wherein the magnetic field sensor comprises a linear current sensor.

6. The magnetic field sensor according to claim 1, wherein the magnetic field sensor comprises a closed loop magnetic sensor.

7. The magnetic field sensor according to claim 1, wherein the coil is wound at least in part around the sensing element, and wherein the sensing element comprises a Hall element.

8. The magnetic field sensor according to claim 1, wherein the magnetic field sensor has a linear output that starts at Vcc/2.

9. A magnetic field sensor IC package, comprising:
a semiconductor die;
a sensing element formed in the semiconductor die;
an analog circuit path including analog circuitry in an active surface of the semiconductor die coupled to the sensing element for generating an output voltage proportional to a magnetic field applied to the sensing element; and
a coil in proximity to the sensing element, the coil having a first terminal that is accessible external to the magnetic field sensor IC package,
wherein the coil is located on an opposite side of a lead frame from the semiconductor die and enclosed in an over molded package, wherein the coil is configured to carry a current to generate a magnetic field having an intensity corresponding to the level of current, wherein the current and the generated magnetic field can vary, wherein a signal applied to the coil forces the magnetic field sensor IC package into a failure mode by a level of current applied to the coil for verifying detection of the failure mode that was forced by the current level of the coil,
wherein during a normal operation the output voltage from the sensing element is compared with a normal operation threshold and an output of the normal operation comparison is provided to a voltage IO pin, and wherein during a diagnostic testing the output voltage from the sensing element is compared to a diagnostic threshold and an output of the diagnostic testing comparison is provided to the voltage IO pin, wherein the diagnostic mode includes the failure mode.

10. The magnetic field sensor of claim 9, wherein the coil is coupled externally to the IC package of the magnetic field sensor to provide a closed loop current sensor.

11. A magnetic field sensor IC package comprising:
a lead frame having a first surface and a second opposing surface;
a semiconductor die having a first surface in which a magnetic field sensing element is disposed and a second opposing surface attached to the first surface of the lead frame, wherein the first surface is an active surface of the semiconductor die;
a non-conductive mold material enclosing the die and at least a portion of the lead frame; and
a conductive coil secured to the non-conductive mold material, wherein the coil has at least one terminal to provide a connection external to the magnetic field sensor, wherein the coil is configured to carry a current to generate a magnetic field having an intensity corresponding to the level of current, wherein the current and the magnetic field can vary, wherein a signal applied to the coil forces the magnetic field sensor IC package into a failure mode by a level of current applied to the coil for verifying detection of the failure mode that was forced by the current level of the coil,
wherein during a normal operation an output voltage from the sensing element is compared with a normal operation threshold and an output of the normal operation comparison is provided to a voltage IO pin, and wherein during a diagnostic testing the output voltage from the sensing element is compared to a diagnostic threshold and an output of the diagnostic testing comparison is provided to the voltage IO pin, wherein the diagnostic mode includes the failure mode.

12. The magnetic field sensor of claim 11, wherein the non-conductive mold material encloses the coil.

13. The magnetic field sensor of claim 11, further comprising a second mold material secured to the non-conductive mold material.

14. The magnetic field sensor of claim 13, wherein the second mold material is ferromagnetic.

15. The magnetic field sensor of claim 11 wherein a housing encloses said coil.

16. A magnetic field sensor IC package, comprising:
a sensing element formed in an active surface of a semiconductor die; an analog circuit path including analog circuitry in the active surface of the semiconductor die coupled to the sensing element for generating an output voltage proportional to a magnetic field applied to the sensing element; and
a coil in proximity to the sensing element, the coil having a first terminal that is accessible external to the magnetic field sensor, wherein the coil is formed on the semiconductor die,
wherein the IC package has exactly four pins, wherein a first one of the four pins is Vcc, a second one of the pins is ground and is electrically coupled to one end of the coil, a third one of the pins is voltage IO, and a fourth one of the pins is connected to the other end of the coil, wherein the coil is disposed proximate the sensing element on the semiconductor die, wherein a signal applied to the coil forces the magnetic field sensor IC package into a failure mode by a level of current applied to the coil for verifying detection of the failure mode that was forced by the current level of the coil,
wherein during a normal operation the output voltage from the sensing element is compared with a normal operation threshold and an output of the normal operation comparison is provided to the voltage IO pin, and wherein during a diagnostic testing the output voltage from the sensing element is compared to a diagnostic threshold and an output of the diagnostic testing comparison is provided to the voltage IO pin, wherein the diagnostic mode includes the failure mode.

17. A magnetic field sensor IC package, comprising:
a leadframe having opposing first and second sides;
a sensing element integrated in an active surface of a die that is disposed on the first side of the leadframe;
an analog circuit path including analog circuitry in the active surface of the semiconductor die coupled to the sensing element for generating an output voltage proportional to a magnetic field applied to the sensing element; and
a coil in proximity to the sensing element, the coil having a first terminal that is accessible external to the magnetic field sensor, wherein the coil is disposed on the second side of the leadframe, wherein the coil is configured to carry a current to generate a magnetic field having an intensity corresponding to the level of current, wherein the current and the magnetic field can vary, wherein a signal applied to the coil forces the magnetic field sensor IC package into a failure mode by a level of current applied to the coil for verifying detection of the failure mode that was forced by the current level of the coil,
wherein during a normal operation the output voltage from the sensing element is compared with a normal operation threshold and an output of the normal operation comparison is provided to a voltage IO pin, and wherein during diagnostic testing the output voltage from the sensing element is compared to a diagnostic threshold and an output of the diagnostic testing comparison is provided to the voltage IO pin, wherein the diagnostic mode includes the failure mode.

18. The IC package according to claim 17, wherein the die is contained in a first mold material and the coil is contained in a second mold material.

19. The IC package according to claim 18, wherein the second mold material is ferromagnetic.

20. A method, comprising:
providing a magnetic field sensor IC package, comprising:
   a semiconductor die;
   a sensing element formed in an active surface of the semiconductor die;
   an analog circuit path including analog circuitry in the active surface of the semiconductor die coupled to the sensing element for generating an output voltage proportional to a magnetic field applied to the sensing element, the analog circuit path including analog circuitry formed at least in part on the active surface of the semiconductor die; and
   a coil in proximity to the sensing element, the coil having a first terminal that is accessible external to the magnetic field sensor IC package, wherein the coil is formed on the semiconductor die, wherein the coil is disposed proximate the sensing element on the semiconductor die;
controlling a signal applied to the coil to analyze a programmed sensitivity of the analog circuit path; and
applying a signal to the coil to force the magnetic field sensor IC package into a failure mode by a level of current applied to the coil for verifying detection of the failure mode that was forced by the current level of the coil,
wherein during a normal operation the output voltage from the sensing element is compared with a normal operation threshold and an output of the normal operation comparison is provided to an voltage IO pin, and wherein during a diagnostic testing the output voltage from the sensing element is compared to a diagnostic threshold and an output of the diagnostic testing comparison is provided to the voltage IO pin, wherein the diagnostic mode includes the failure mode.

21. The method according to claim 20, further including controlling the signal applied to the coil to test offset cancellation.

22. The method according to claim 20, further including canceling an effect of the magnetic field generated by the coil in an output of the magnetic field sensor IC package.

23. The method according to claim 20, further including testing for drift in a gain of the analog circuit path on the output voltage.

24. The method according to claim 20, further including testing for drift in a zero field output signal.

25. A magnetic field sensor IC package, comprising:
   a semiconductor die having an active surface;
   a leadframe on which the die is disposed;
   a sensing element formed in the active surface of the semiconductor die;
   an analog circuit path including analog circuitry in the active surface of the semiconductor die coupled to the sensing element for generating an output voltage proportional to a magnetic field applied to the sensing element; and
   a multi-turn coil in proximity to the sensing element, wherein the coil is located on an opposite side of the leadframe as the die, the coil having a first terminal that is accessible external to the magnetic field sensor IC package, wherein a signal applied to coil forces the magnetic field sensor IC package into a failure mode by a level of current applied to the coil to verify detection of the failure mode,
wherein during a normal operation the output voltage from the sensing element is compared with a normal operation threshold and an output of the normal operation comparison is provided to an voltage IO pin, and wherein during diagnostic testing the output voltage from the sensing element is compared to a diagnostic threshold and an output of the diagnostic testing comparison is provided to the voltage IO pin, wherein the diagnostic mode includes the failure mode.

* * * * *